(12) United States Patent
Lung

(10) Patent No.: US 6,461,906 B1
(45) Date of Patent: Oct. 8, 2002

(54) METHOD FOR FORMING MEMORY CELL BY USING A DUMMY POLYSILICON LAYER

(75) Inventor: Hiang-Lan Lung, Hsin-Chu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/805,565

(22) Filed: Mar. 14, 2001

(51) Int. Cl.⁷ .......................................... H01L 21/8238
(52) U.S. Cl. ..................... 438/216; 428/258; 428/287
(58) Field of Search ................................ 438/201, 216, 438/258, 261, 275, 287

(56) References Cited

U.S. PATENT DOCUMENTS 5,098,855 A * 3/1992 Komori et al. ............. 438/275
5,175,120 A * 12/1992 Lee ............................ 438/258
6,174,758 B1 * 1/2001 Nachumovsky ............. 438/258

* cited by examiner

Primary Examiner—Chandra Chaudhari

(57) ABSTRACT

The present invention provides a method for forming a memory cell. The method comprises providing a substrate and then forming a dielectric layer on the substrate. Following, a conductive layer and a stop layer are sequentially formed on the dielectric layer. Then, a bit line pattern is defined on the substrate to form bit lines. Next, spacers are formed on the sidewalls of the conductive layer and the polishing layer and then a self-aligned silicide process is proceeded. Following, an oxide layer is filled into the bit lines and the oxide layer is etched or polished to stop on the stop layer by etch back or chemical mechanism polishing method. Last, the stop layer is removed and a polysilicon layer is deposited to form word lines.

32 Claims, 11 Drawing Sheets

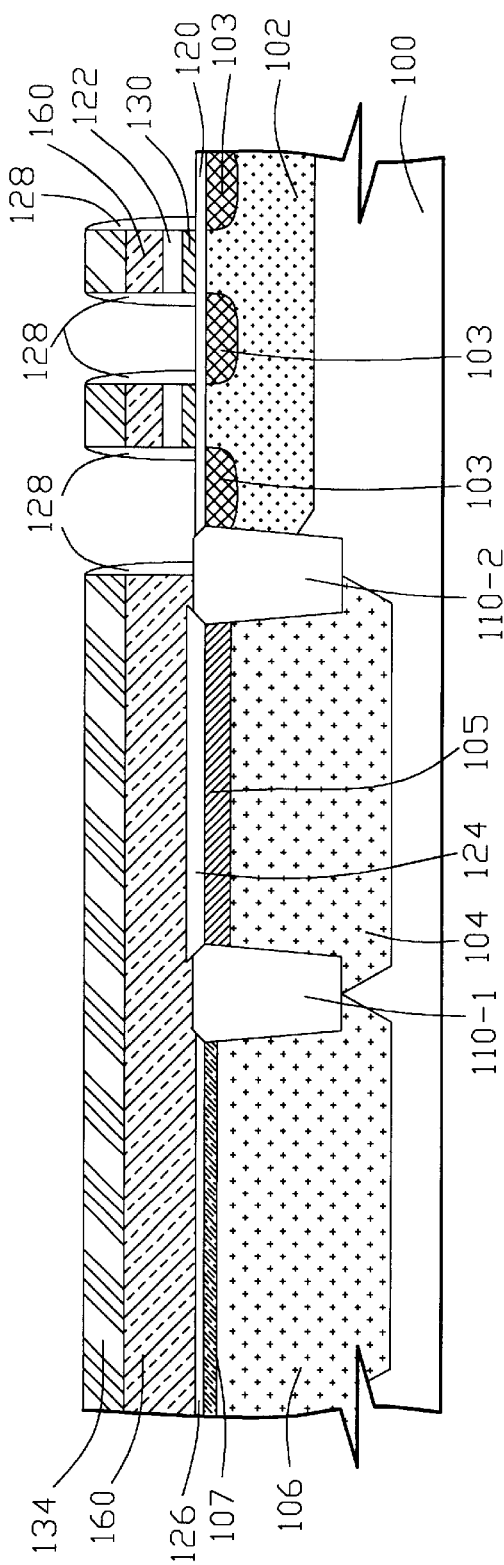
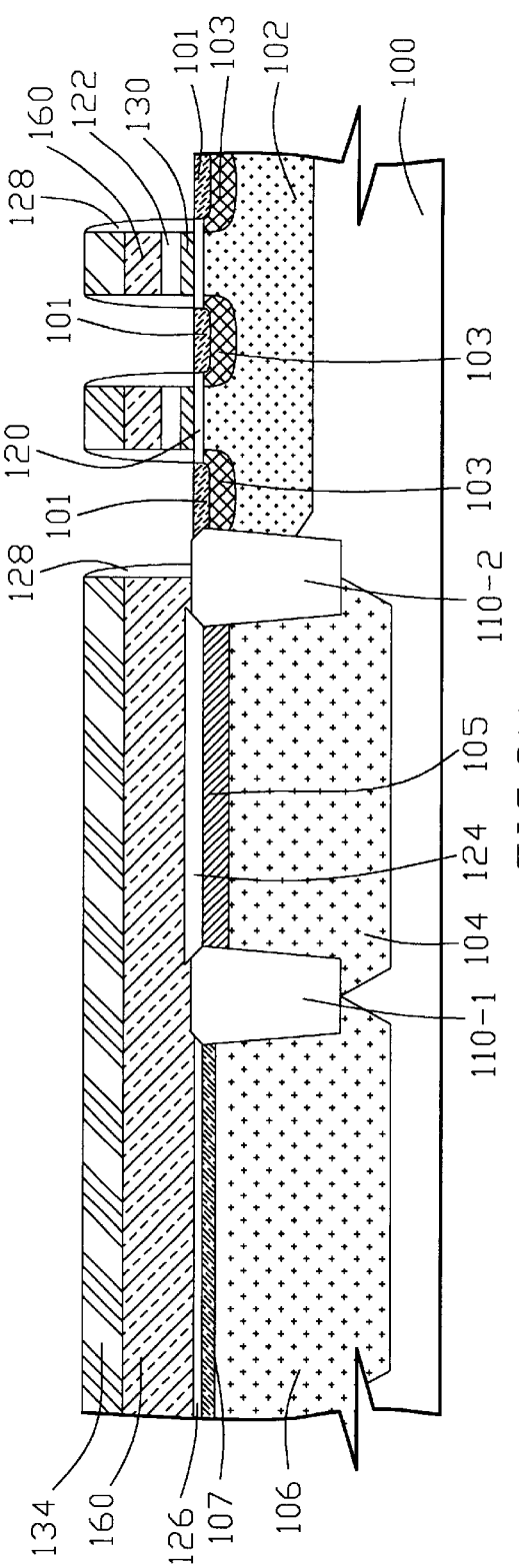

METHOD FOR FORMING MEMORY CELL BY USING A DUMMY POLYSILICON LAYER

BACKGROUND OF THE INVENTION

1. Field of the Invention

The present invention generally relates to a method for forming memory array, and more particularly relates to a method for forming memory cells by using a dummy polysilicon layer.

2. Description of the Prior Art

A conventional nitride read only memory (NROM) cell is shown as FIG. 1. The cell comprises a substrate 10 which is implanted to form a source 12 and a drain 14 therein and a structure 16 of oxide/nitride/oxide (ONO) is placed thereon. The structure 16 of oxide/nitride/oxide has a nitride layer 17 between a first silicon oxide layer 18 and a second silicon oxide layer 20. Furthermore, a gate conductor 22 is placed on the structure 16 of oxide/nitride/oxide. A channel 15 between the source 12 and the drain 14 is formed below the structure 16 of oxide/nitride/oxide.

The nitride layer 17 provides a retaining electron mechanism for programming memory cells. In particular, when the source 12, the drain 14 and the gate conductor 22 are supplied with a voltage, electrons may flow forward to the drain 14. According to the hot electron injection effect, some hot electrons may penetrate through the first silicon oxide layer 18 below the nitride layer 17, and may be collected into the nitride layer 17 particularly when the first silicon oxide layer 18 is very thin. In view of known technologies, the nitride layer 17 may retain the accepted electrons 24 of an aggregation region near the drain 14. The aggregated electrons 24 observably raises a threshold voltage of neighboring memory cell channel near the drain 14, which is higher than a threshold voltage of the left channel 15.

During reading period, the primal source electrically exchanges with the primal drain. It means that the source 12 is supplied with a high voltage while the drain 14 is with a low voltage. When the higher voltage reads the memory cell in the existence of the aggregated electrons 24, it may prohibit the cell from being at a conductivity state. On the other hand, in absence of the aggregated electrons 24, the reading voltage of the gate conductor 22 may overcome a lower threshold voltage and the channel 15 may reverse to conduct.

FIG. 2 is a side view of a row in a conventional memory array which uses the memory cell mentioned above. A plurality of bit lines 12 are sources or drains of the memory cell, which together with the oxide devices of the bit lines 50 are isolated each another by the structures of the oxide 18, the nitride 17 and the oxide 20. Polysilicon 60 for forming word lines is over the structures of the oxide 18, the nitride 17, the oxide 20 and the oxide devices of the bit lines 50. The word lines above the structures of the oxide 18, the nitride 17 and the oxide 20 are gate structures of the memory cell. In the memory array, the oxide device of bit lines 50 are formed by the method of local oxidation of silicon (LOCOS) so that the bit lines below are not formed by the method of self-aligned silicide for reducing resistance. Furthermore, the higher thermal budget may be improved during the ongoing process.

SUMMARY OF THE INVENTION

The main object of the invention is to provide a dummy layer for protecting gate oxide and structure of oxide/nitride/oxide from damage during forming bit lines. In the present invention, the dummy layer may be used for defining the bit lines of self-aligned silicide for reducing resistance.

Another object of the invention is to make the bit lines have little thermal budget so that they may be helpful for scale micro-shrinkage and can be made the smaller space of cell and the channel length. There are two steps for reducing the thermal budget. The peripheral gate oxide and structure of oxide/nitride/oxide are formed earlier than the formation of bit lines such that the thermal budget of memory array is reduced. The second step is to form bit line oxide by the method of high density plasma deposition or spin-on-glass that can reduce the thermal budget of memory array, rather than conventional thermal oxidation.

In order to achieve previous objects of the invention, a method for forming a memory cell comprises providing a substrate first, and forming a dielectric layer on the substrate. In the present invention, the dielectric structure comprises a structure of oxide/nitride/oxide or an oxide layer. The structure of oxide/nitride/oxide may be formed nitride read-only memory, while the oxide layer may be formed mask read-only memory. Next as a key step of the present invention, a first polysilicon layer and a silicon nitride layer are sequentially formed on the dielectric layer. Then a bit line pattern is defined on the substrate to form a bit line. The formation of bit line comprises etching the partial dielectric layer. Next, a plurality of spacers are formed on the sidewalls of the first polysilicon layer and the silicon nitride layer, and bit lines are for forming salicide by a method of self-aligned silicide. The following is another key step of the present invention. A word line oxide layer is formed by the method of high density plasma chemical vapor deposition, or spin-on glass process. Then the oxide layer is etched to stop on the silicon nitride layer by the chemical mechanic polishing or etching back method. Finally, the silicon nitride layer is removed and word lines are then formed by depositing a second polysilicon layer.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
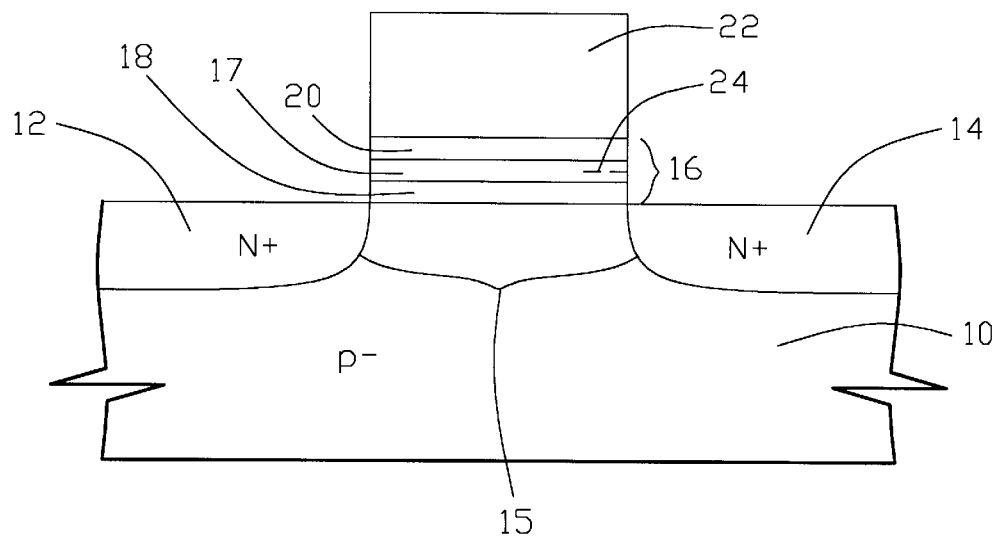
FIG. 1 is a schematic representation of the structure of conventional nitride read only memory cell.
Figure 2:
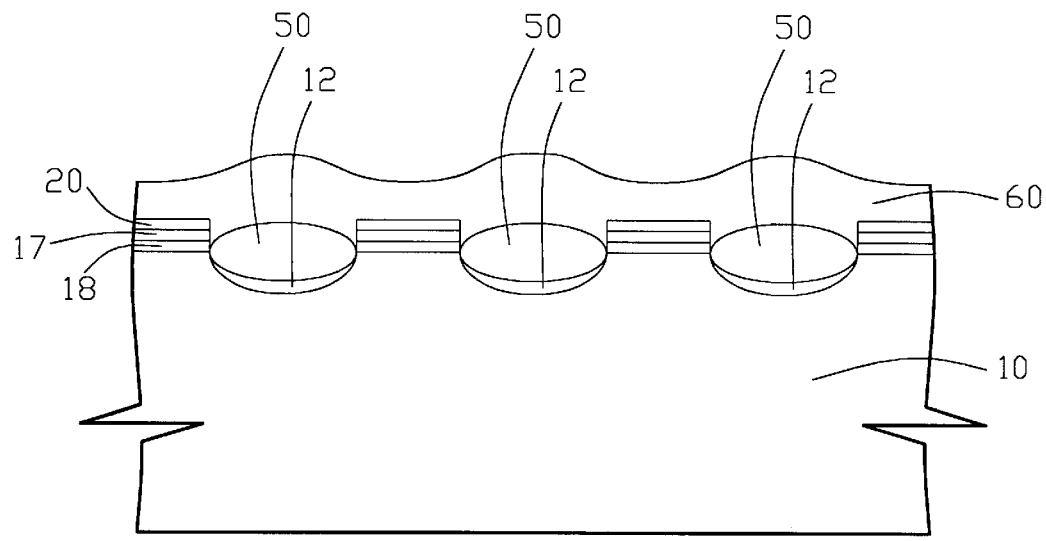
FIG. 2 is a schematic representation of the structure of the formation of a memory array on the wafer, in accordance wit prior techniques.

The semiconductor devices of the present invention are applicable to a broad rang of semiconductor devices and can be fabricated from a variety of semiconductor materials. The following description discusses several presently preferred embodiments of the semiconductor devices of the present invention as implemented in silicon substrates, since the majority of currently available semiconductor devices are fabricated in silicon substrates and the most commonly encountered applications of the present invention will involve silicon substrates. Nevertheless, the present invention may also be advantageously employed in gallium arsenide, germanium, and other semiconductor materials. Accordingly, application of the present invention is not intended to be limited to those devices fabricated in silicon semiconductor materials, but will include those devices fabricated in one or more of the available semiconductor materials.

Further, while the present invention is illustrated by a number of preferred embodiments directed to silicon semiconductor devices, it is not intended that illustrations be a limitation on the scope or applicability of the present invention. Further, while the illustrative examples use insulated gate control structures, it should be recognized that the insulated gate portions may be replaced with light activated or current activated structure(s). Thus, it is not intended that the structures illustrated. These devices are included to demonstrate the utility and application of the present invention to presently preferred embodiments.

Moreover, various parts of the semiconductor elements have not been drawn to scale. Certain dimensions have exaggerated in relation to other dimensions in order to provide a clearer illustration and understanding of the present invention. For the purposes of illustration the preferred embodiment of the semiconductor devices of the present invention have been shown to include specific P and N type regions, but it should be clearly understood that the teachings herein are equally applicable to semiconductor devices in which the conductivities of the various regions have been reversed, for example, to provide the dual of the illustrated device. Enhancement and depletion mode structures may be similarly interchanged.

Moreover, although the embodiments illustrated herein are show in two-dimensional views with various regions having width and depth, it should be clearly understood that these regions are illustrations of only a portion of a single cell of a device, which may include a plurality of such cells arranged in a three-dimensional structure. Accordingly, these regions will have three dimensions, including length, width and depth, when fabricated in an actual device.

The present invention provides a method for forming a memory cell on a semiconductor. The method provides a substrate first, and forms a dielectric layer on the substrate. In the present invention, the dielectric structure comprises a structure of oxide/nitride/oxide or an oxide layer. The structure of oxide/nitride/oxide may be formed nitride read-only memory, while the oxide layer may be formed mask read-only memory. Next as a key step of the present invention, a dummy layer and an etching stop layer are sequentially formed on the dielectric layer. Then a bit line pattern is defined on the substrate to form a bit line. Next, a plurality of spacers are formed on the sidewalls of the dummy layer and the etching stop layer, and a bit line is to form salicide by a method of self-aligned silicide for reducing resistance. The following is another key step of the present invention. A word line oxide layer is formed by the method of high density plasma chemical vapor deposition, or spin-on glass process. Then for polishing plump silicon oxide layer, the oxide layer is etched to stop on the dummy layer which is a stop layer by the chemical mechanic polishing or etching back method. Finally, the silicon nitride layer is removed and word lines are then formed by depositing a second polysilicon layer.

Figure 3A:
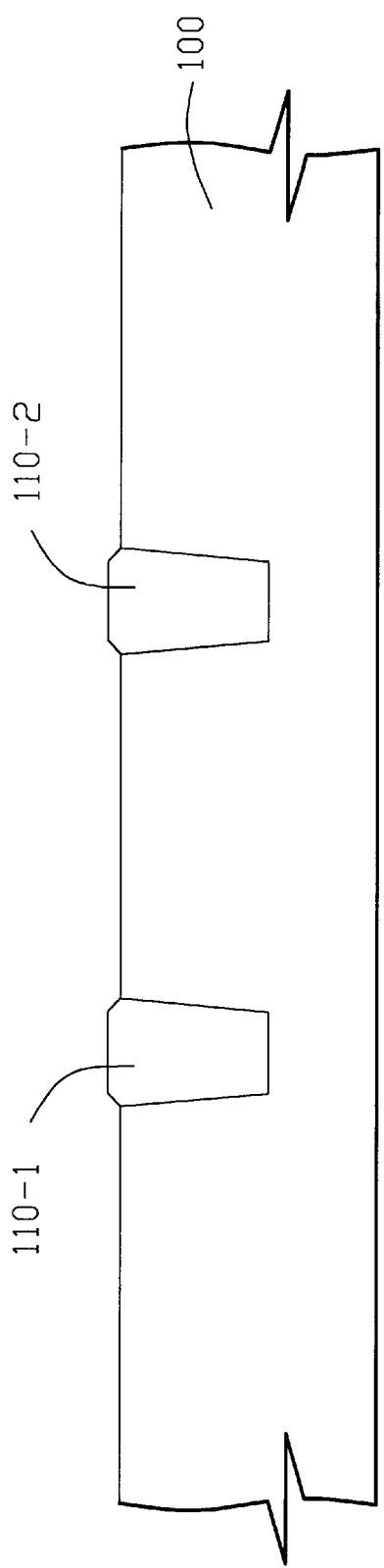
FIGS. 3A–3N are schematic representations of structures during the formation of a memory array on the wafer, in accordance with the present invention.
Figure 3B:
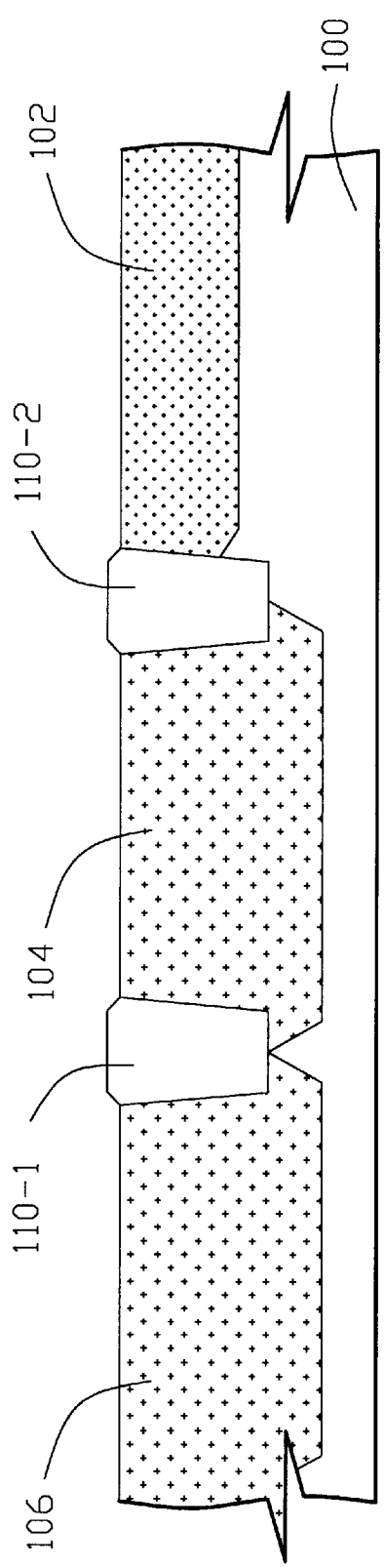
Figure 3C:
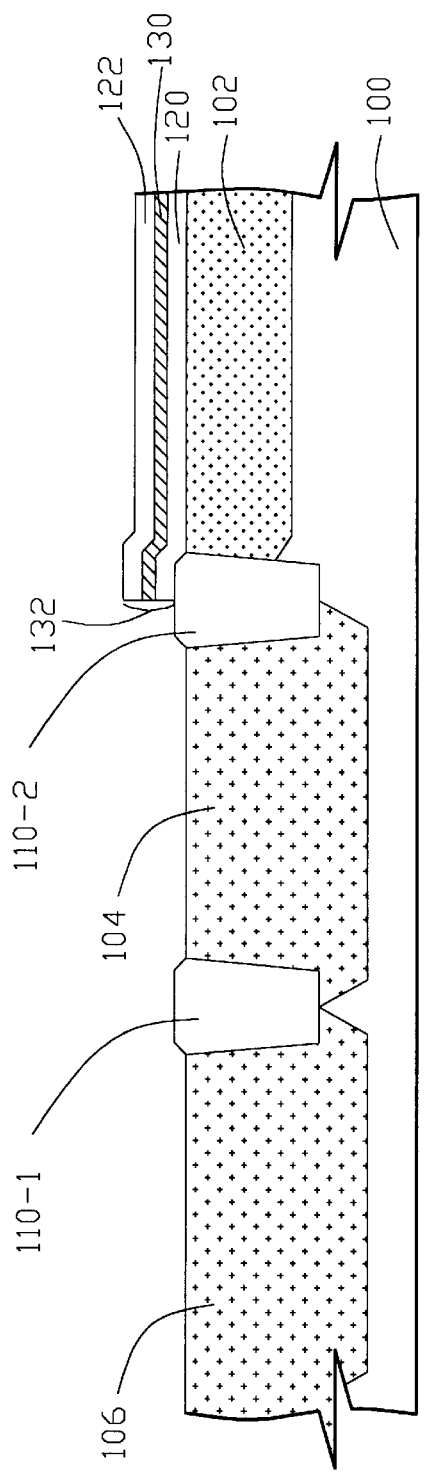
Figure 3D:
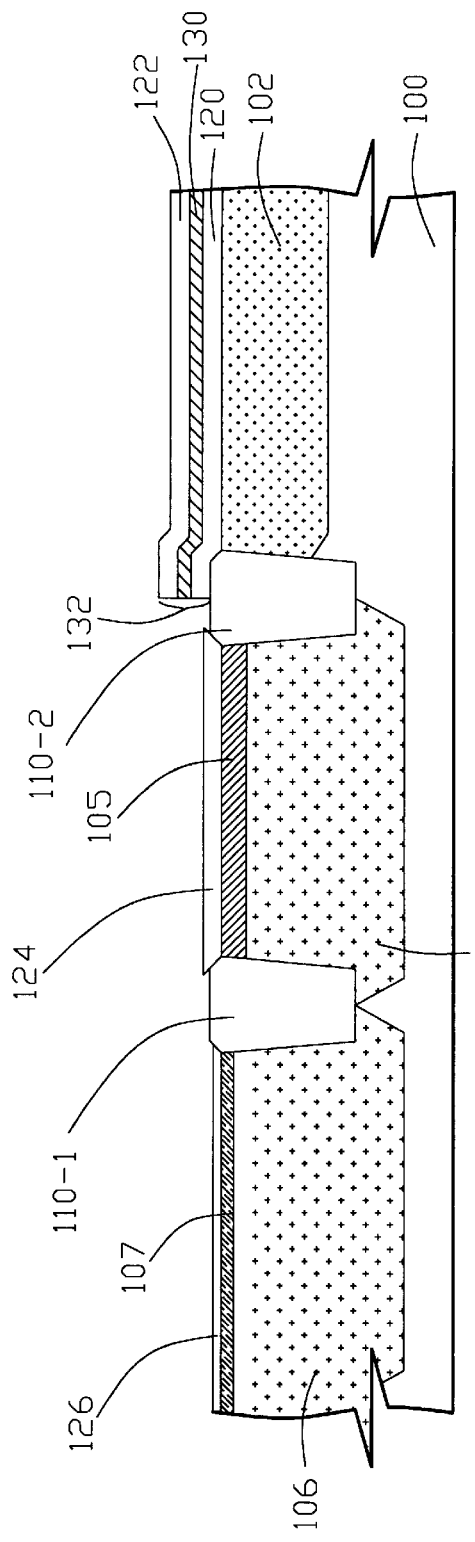
Figure 3E:
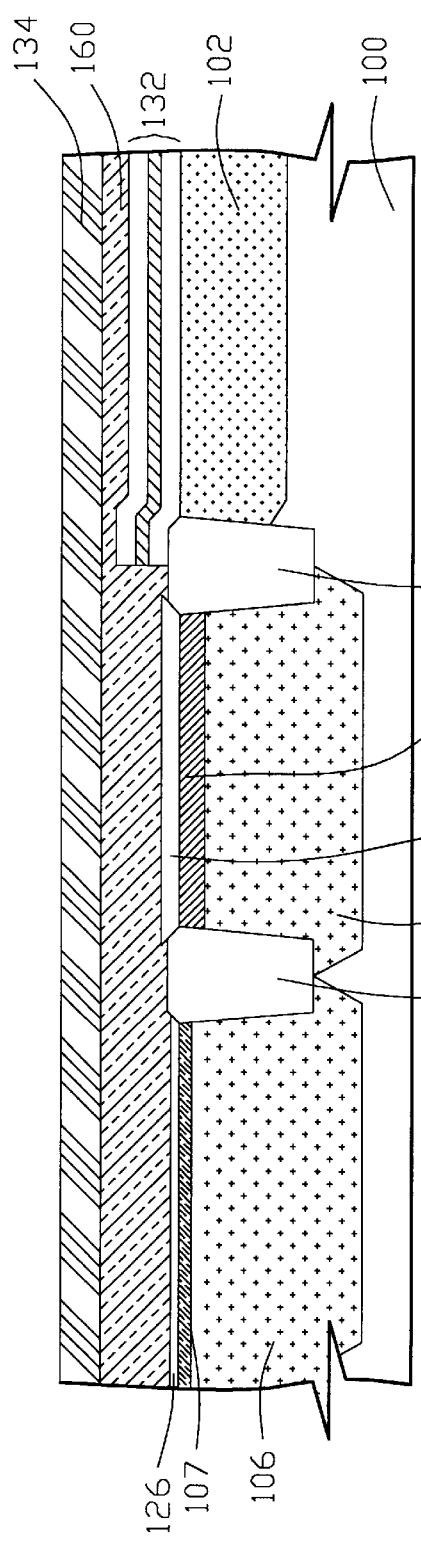
Figure 3F:
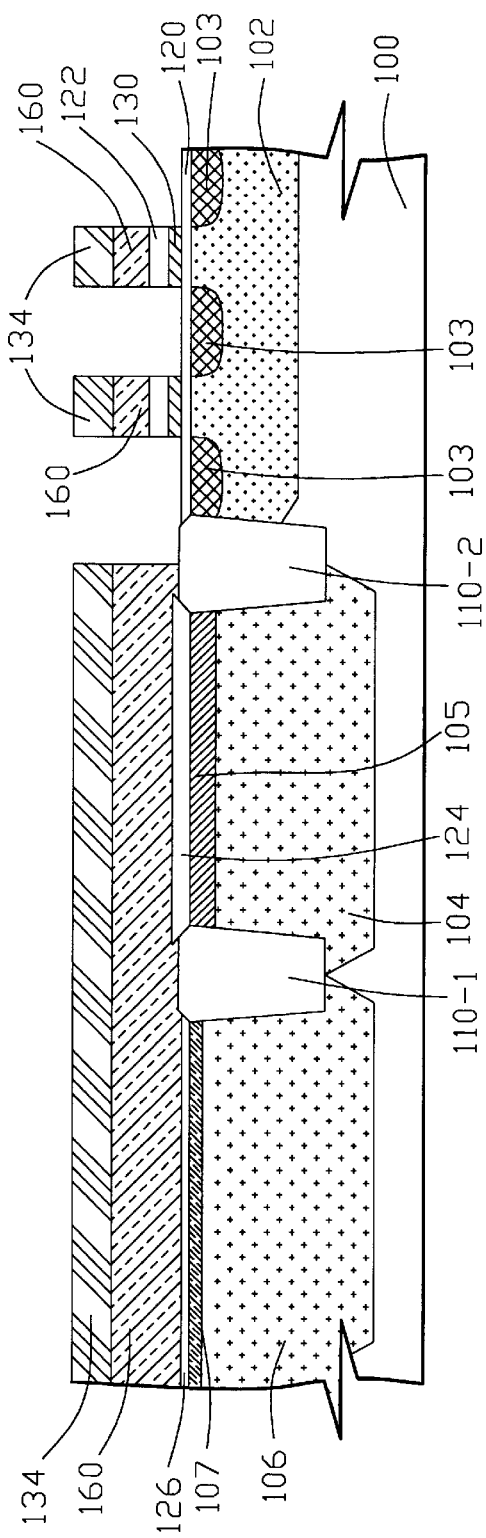
Figure 3I:
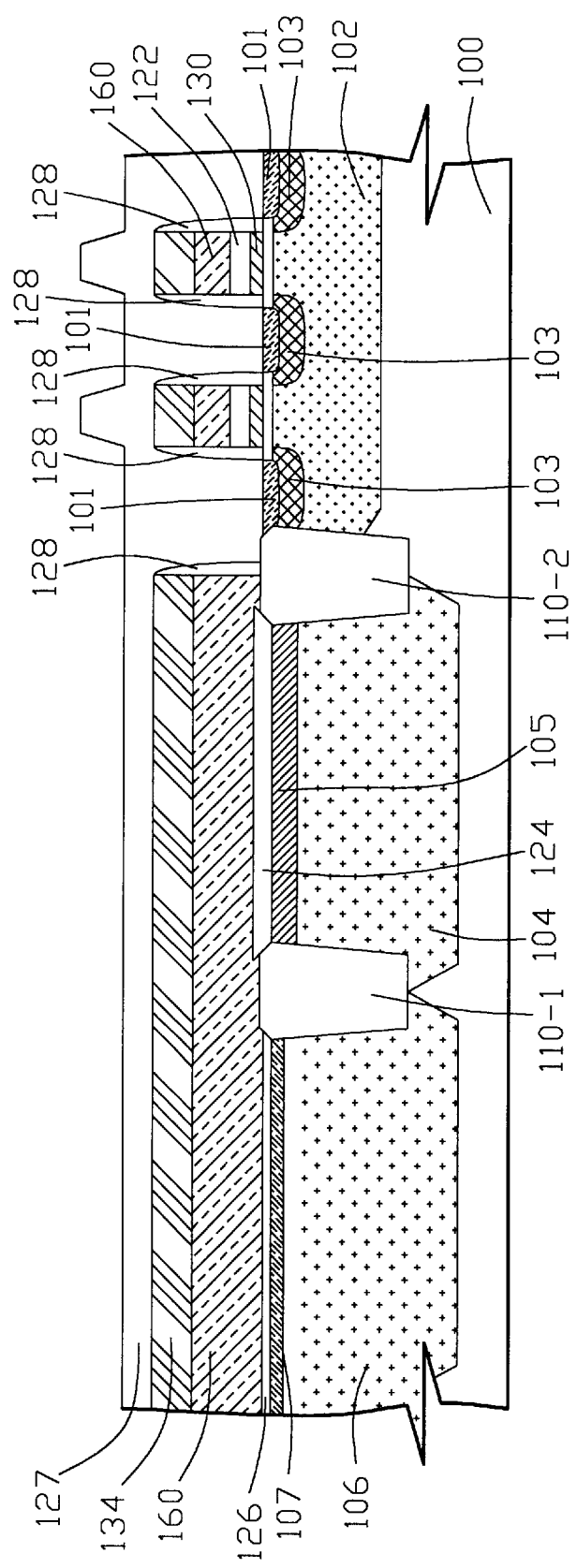
Figure 3J:
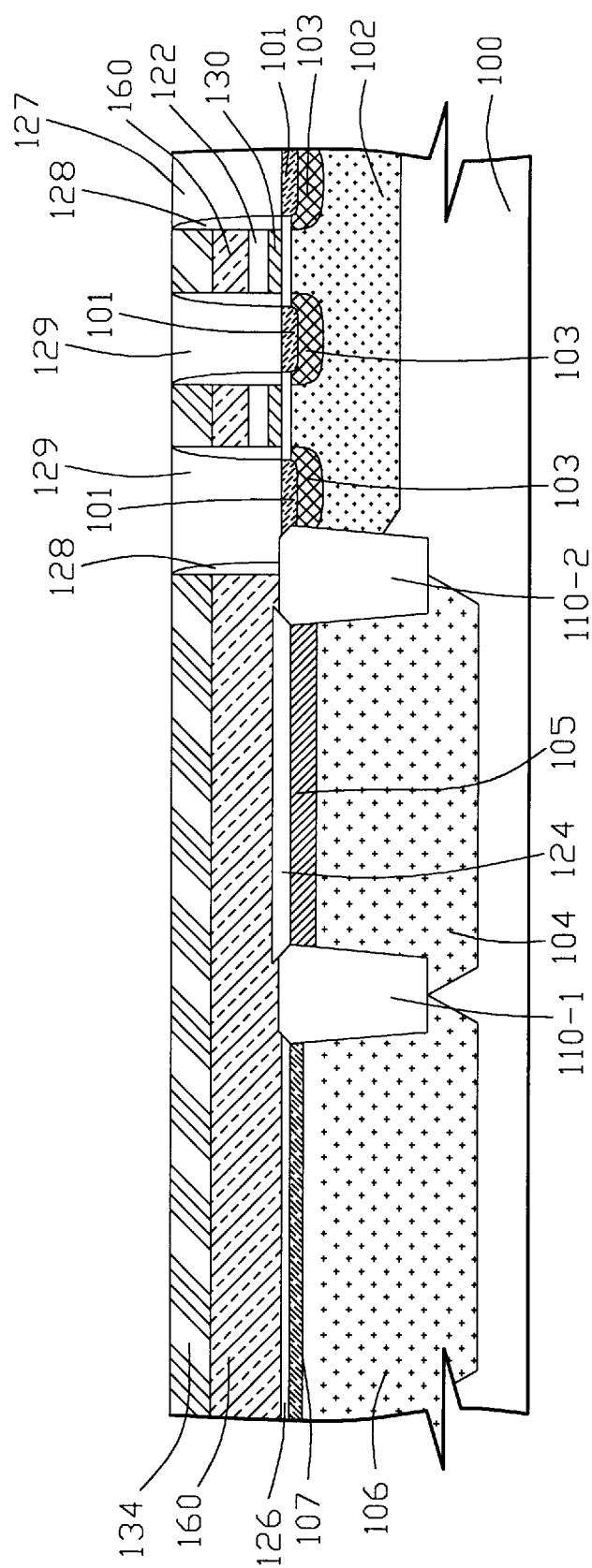
Figure 3K:
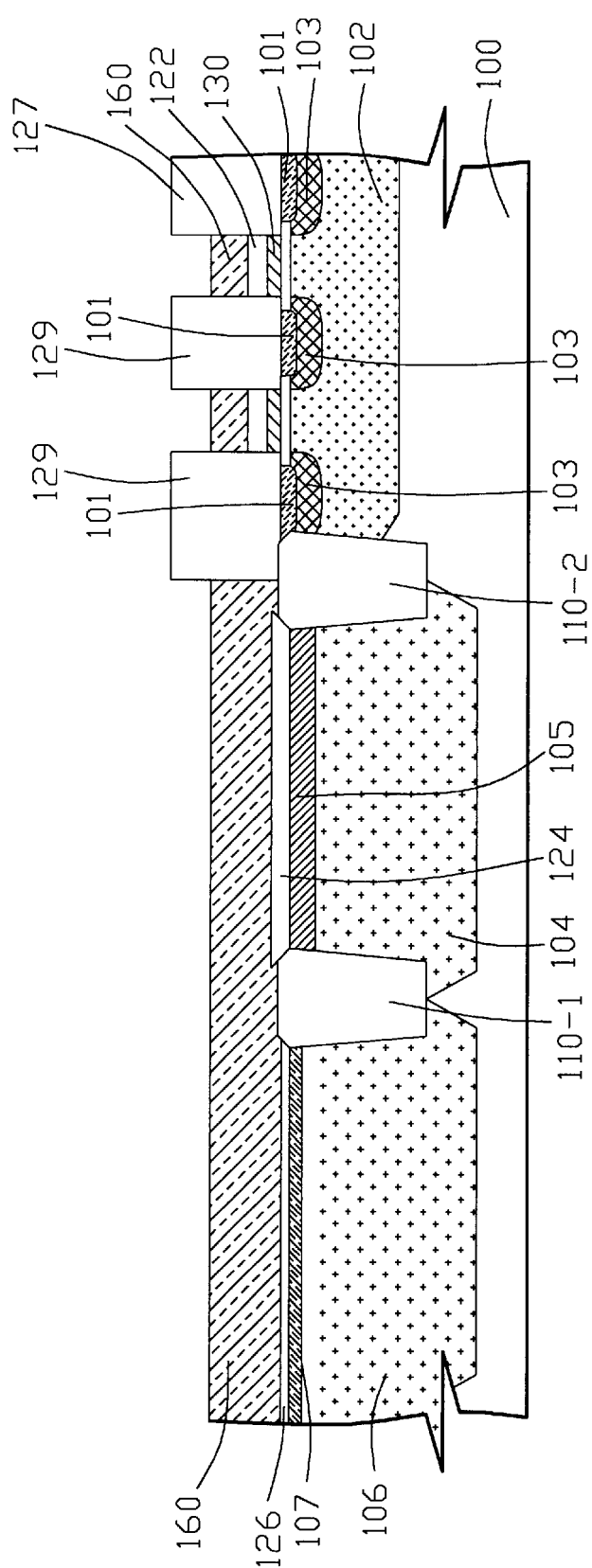
Figure 3L:
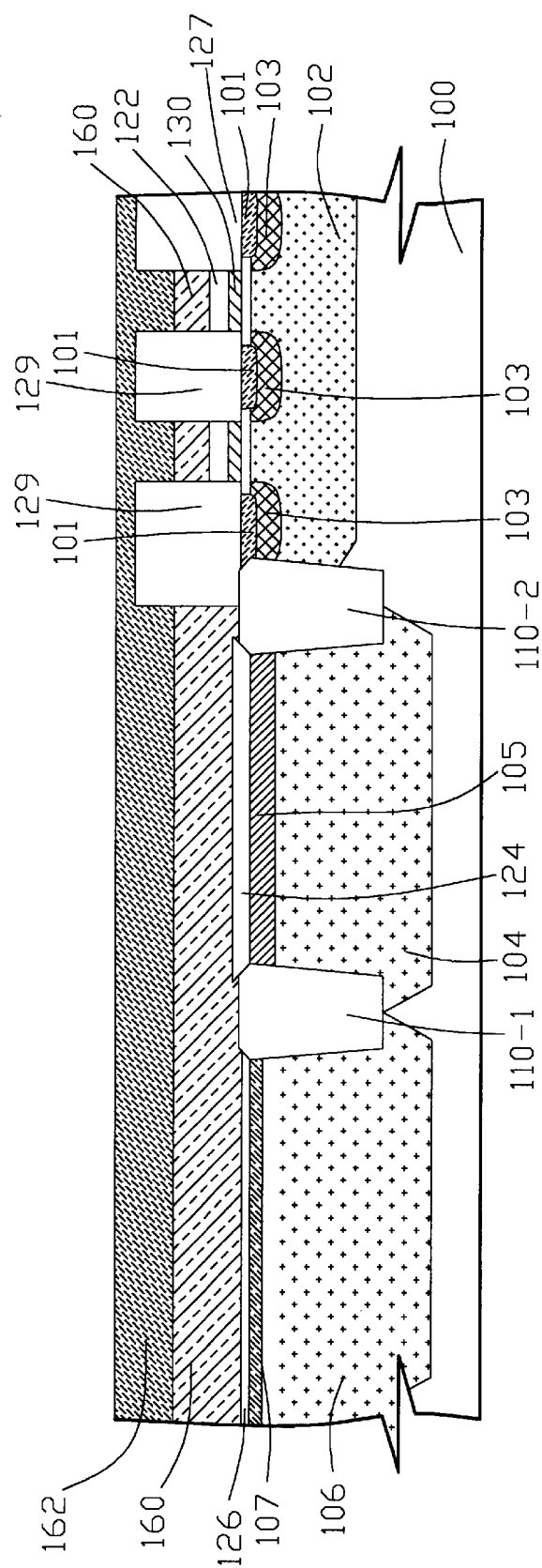
Figure 3M:
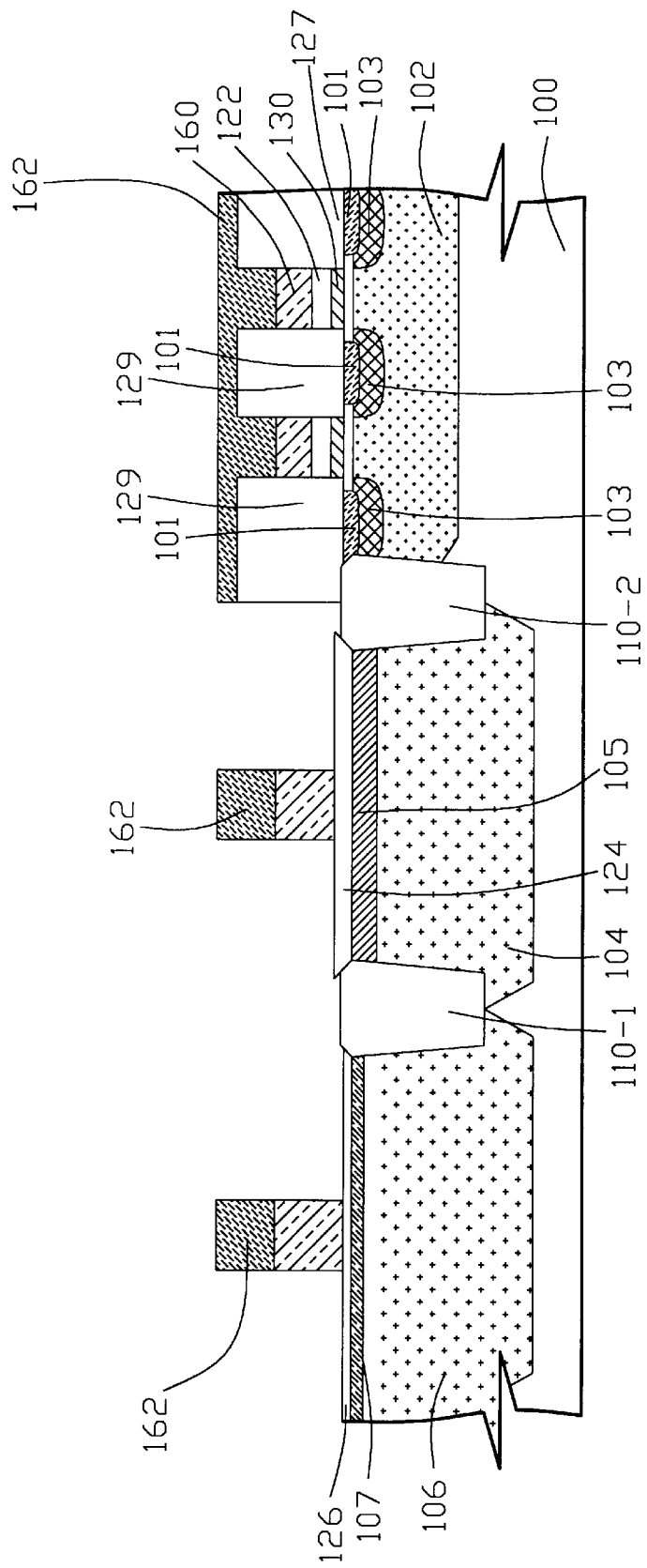
Figure 3N:
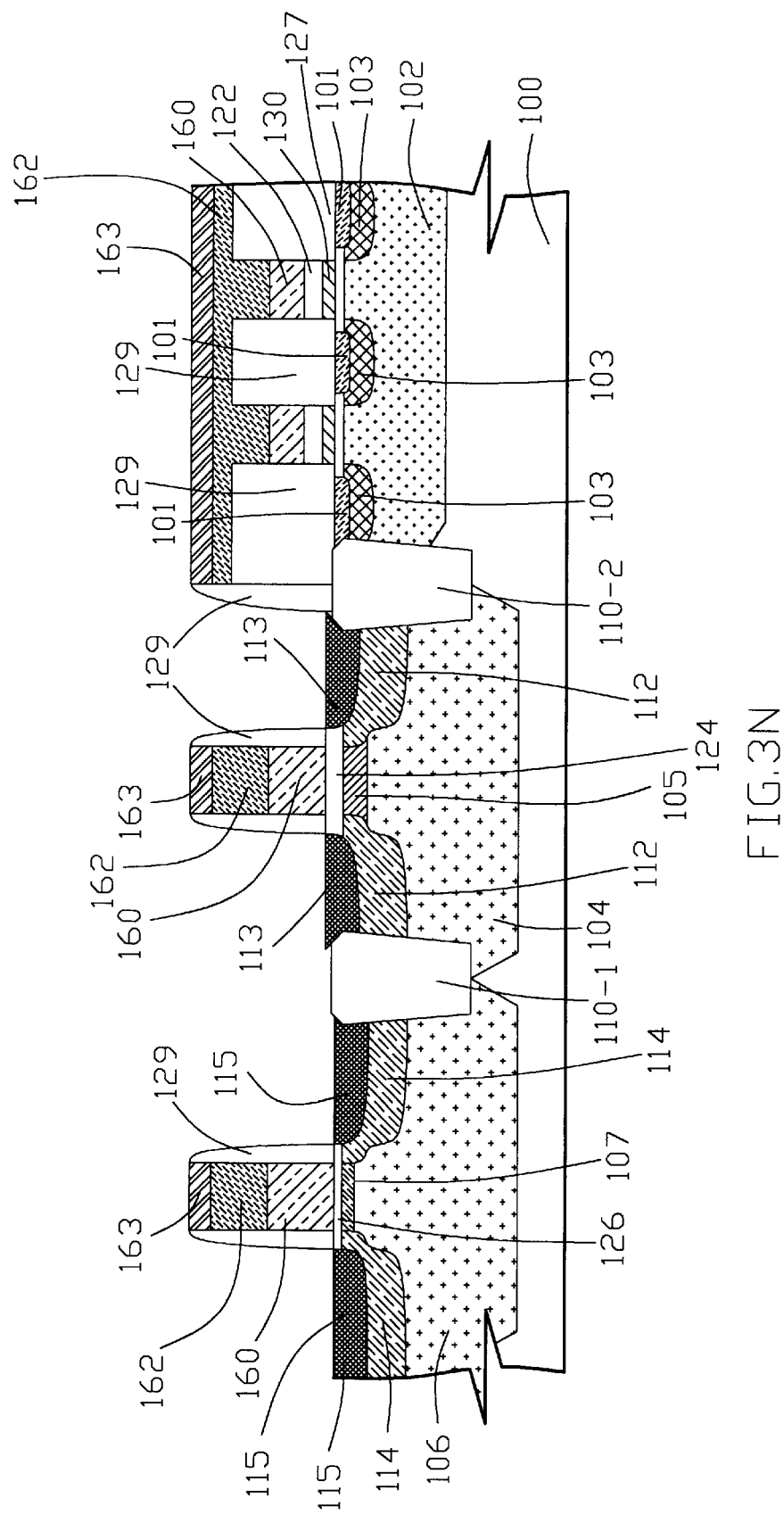

Following the preferred embodiment of the present invention is introduced with reference to the drawings of FIG. 3A to FIG. 3N. In the preferred embodiment, memory cell and metal-oxide semiconductor devices are formed simultaneously, and high and low voltage metal-oxide semiconductor devices are formed subsequently. (Typically, most of read-only programmable memories need both high and low voltage devices.) Furthermore, nitride read-only memories used in the preferred embodiment are also applied in mask read-only memories.

Referring to FIG. 3A, a plurality of isolation devices 110 are formed on a substrate 100. The isolation devices 110 are shallow trench isolation (STI) devices. However, field oxide devices formed by the conventional method of local oxidation of silicon maybe also used. For forming shallow trench isolation devices, a silicon nitride layer and a photoresist layer (not shown) are subsequently formed on the substrate 100, and then a pattern of shallow trench isolation is pattern-transferred into the photoresist by the conventional method of photolithography. Next, using the photoresist as a mask, the silicon nitride layer is etched to transfer the pattern of the shallow trench isolation thereto. Following, the substrate 100 is etched to form a plurality of trenches by using conventional etching methods. Next, a silicon oxide layer is filled into the trenches and oxidized by thermal oxidation followed by removing the photoresist and silicon nitride layers. In the embodiment, the outside of the isolation device 110-2 is the memory array of a wafer, and metal-oxide-semiconductor devices are, on and between, the outside of the isolation device 110-1 and isolation devices 110.

As shown in FIG. 3B, a plurality of wells 104 and 106 are formed in the region of the metal-oxide-semiconductor devices, while a region of cell implantation 102 is formed in the region of the memory array. In the embodiment, the well 104 and the well 106 are ion-implanted by using boron or phosphoric ions as ion source (boron ions are for NMOS, while phosphoric ions are for PMOS). The implants in the cell region of cell implantation 102 are boron. The implants dose in the wells 104 and 106 is about between 10E12 to 10E13 atoms/cm2, while one in the region of cell implantation 102 is about 10E12 to 10E13 atoms/cm2.

Referring to FIG. 3C, a structure of oxide/nitride/oxide 132 is formed on the memory array, for which a silicon nitride layer 130 is between a first oxide layer 120 and a second oxide layer 122. In the embodiment, the structure 132 of oxide/nitride/oxide is deposited to form nitride programmable read-only memory. For the formation of the structure 132 of oxide/nitride/oxide (ONO), a bottom-side silicon oxide layer 120, a silicon nitride 130, and a top-side silicon oxide layer 122 are subsequently formed on the memory array region of the substrate 100 and thereafter a photoresist layer is formed on the memory cell region, then the ONO layer of periphery region is removed by RIE method. The structure 132 of oxide/nitride/oxide may be also first formed followed by the removal of the structure 132 on the metal-oxide-semiconductor devices. The silicon oxide layer 120 is formed by using thermal oxidation that wafer is placed into furnace at temperature about 750 to 1000° C., and the thickness of the silicon oxide layer 120 is about 20 to 150 Angstroms. The silicon nitride layer 130 is formed by using conventional chemical vapor deposition and has a thickness about 20 to 150 Angstroms. The formation of the silicon oxide layer 122 is an oxidation of the silicon nitride by using the chemical vapor deposition or thermal oxidation, or both methods above. The thickness of the silicon oxide layer 122 is about 50 to 100 Angstroms. It is noticeable that the thickness of the silicon nitride should be thicker when the method of thermal oxidation is used. Generally, the bottom-side silicon nitride layer 130 should have half thickness more than typical one does.

Next, as shown in FIG. 3D, the threshold implantation regions 105 and 107 and the gate oxide layers 124 and 126 are formed in the region of metal-oxide-semiconductor devices. In the embodiment, one of the metal-oxide-semiconductor devices is a high voltage device and the other one is a low voltage device. Referring to FIG. 3D, the metal-oxide-semiconductor between the isolation devices 110 is the high voltage device, while one outside the isolation device 110-1 is the low voltage 20 device. In the embodiment, the threshold implantation regions 105 and 107 are formed by using conventional ion implantation, while gate oxide layers 124 and 126 are formed by using conventional thermal oxidation. The thickness of gate oxide layer 124 is about 120 to 200 Angstroms and one of gate oxide layer 126 is about 30 to 90 Angstroms.

Next, as a key step of the present invention is shown as FIG. 3E. A polysilicon layer 160 and a silicon nitride layer 134 are subsequently deposited over the wafer. The polysilicon layer 160 is used as a dummy layer for protecting the structure 132 of oxide/nitride/oxide below, and further defining the pattern of the bit lines. In the embodiment, considering the process and cost, the polysilicon layer is selected for a dummy layer. However, tungsten, tantalum or silicide such as silicon tungsten may be also selected for the dummy layer. Of course the different etching method in following process may correspond to the selected different material. The silicon nitride layer 134 is used not only for protecting the polysilicon layer 160, but also further for a stop layer for following step of the chemical mechanic polishing or etch back. In the embodiment, the polysilicon layer 160 is formed by the method of low pressure chemical vapor deposition (LPCVD), and its thickness is about 400 to 800 Angstroms. The silicon nitride layer 134 is formed by conventional plasma enhanced chemical vapor deposition (PECVD) or low pressure chemical vapor deposition, and its thickness is about 100 to 300 Angstroms.

Shown as FIG. 3F, the silicon nitride layer 134, the polysilicon layer 160, the silicon oxide layer 122 and the silicon nitride layer 130 are subsequently partially etched and thereafter a plurality of bit lines 103 are formed in the cell implantation region 102. A photoresist layer (not shown) is first deposited and thereafter has openings thereon formed by using the conventional method of photolithography. By using the photoresist layer as a mask the silicon nitride layer 134, the polysilicon layer 160, the silicon oxide layer 122, and the silicon nitride layer 130 are subsequently anisotropically etched by the method such as reactive ion etching (RIE) method. Then the photoresist layer is removed. The formation of bit lines 103 is performed by implanting ions into the cell implantation region 102. The dopants of the bit lines 103 are generally arsenic ions with a dose about $2\times10E15$ to $4\times10E15$ atoms/cm2. In particular, the polysilicon layer 160 provides a mask for ion implantation. The oxide layer 120 is a sacrificial oxide layer for ion implantation and thereafter is removed in the self-aligned silicide process.

As shown in FIG. 3G, a plurality of spacers 128 are formed at side walls of the polysilicon layer 160 and the silicon nitride layer 134. The formation of the spacers 128 is by using the conventional method, such as low pressure chemical vapor deposition. First, a silicon oxide layer is deposited over the wafer, and thereafter is totally etched by the method of anisotropy etching to form the spacers 128. In here, the spacers 128 is mainly used to encapsulate the polysilicon layer 160 so as to go through the following the self-aligned silicide process.

Next, as a key step of the present invention is depicted in FIG. 3H. A plurality of salicide 101 are formed on the bit lines 103 by the method of self-aligned silicide. In the embodiment, the metal used in the self-aligned silicide may be cobalt, titanium, tungsten or copper. The main purpose of the method may reduce the resistance of the bit lines 103. For typically self-aligned silicide process, a metal layer is first deposited over the surface of the wafer and thereafter a salicide layer is formed by reaction of deposited metal layer and silicon at high temperature. The metal layer on the spacers 128 or nitride layer 134 may be removed by the wet etching method.

Next step is also a key of the present invention shown as FIG. 3I. An oxide layer 127 is formed by the high density chemical vapor deposition or spin-on-glass. The oxide layer 127 is for providing bit line oxide and the thickness thereof is at least higher than the openings on the bit lines 103. The formation of oxide layer 127 by high density chemical vapor deposition or spin coating is to reduce the thermal budget resulting from forming oxide. Next, as shown in FIG. 3J, the plump oxide 127 is removed by the conventional method of chemical mechanical polishing or etch back. In the embodiment, the silicon nitride layer 134 is used for the etching or polishing stop layer.

Depicted in FIG. 3K, the silicon nitride layer 134 is removed by sinking the wafer into a tank containing hot phosphoric acid because of good selectivity provided by wet etching. The silicon nitride layer 134 also can be removed by reactive ions etching method.

Next referring to FIG.3L, a polysilicon layer 162 is deposited over the wafer. The polysilicon layer 162 is for forming word lines in the memory cell, and on the other hand, which is for forming gates in the metal-oxide-semiconductor devices. In the embodiment, the polysilicon layer 162 can be made by any conventional method, such as low pressure chemical vapor deposition, and the thickness of the polysilicon layer 162 is about 1500 to 2000 Angstroms.

Shown as FIG. 3M, the word lines and a polysilicon gate 160 are simultaneously formed by the conventional photolithography and etching methods. A photoresist layer (not shown) is first deposited on the wafer, and thereafter the pattern for forming the gates of the metal-oxide-semiconductor devices and the word lines of the memory cell is transferred into thereon by the method of photolithography. By using the photoresist layer as a mask, the polysilicon layer 162 is etched and then the photoresist layer is removed. In FIG. 3M, there isn't any change shown in the process of pattern transference, it is because that the pattern of the word lines is parallel to the cross section of FIG. 3M and perpendicular to the bit lines. If the cross section of the figure is the cross section parallel to one of the bit lines for the memory cell, the change in the process of pattern transference may be shown up. Now the whole structure of the memory cell is made out and thereafter the process of metal-oxide-semiconductor devices on a conventional chip goes through.

Referring to FIG. 3N, a plurality of spacers 129, source/drain regions 114, salicide 115 and salicide 163 are subsequently formed in the region of the metal-oxide-semiconductor devices. First, the spacers 129 are formed at side walls of the gates by the similar method. Next, the source/drain regions 114 are formed by conventional method of ion implantation into the substrate 100. Finally, the salicide 115 and the salicide 163 are formed by the self-aligned silicide process.

To sum up the foregoing in the present invention, a dummy layer is used to protect the gate oxide and the structure of oxide/nitride/oxide from damages during the process of forming bit lines. Moreover, the dummy layer may be used to define the bit lines of self-aligned silicide for reducing the resistance. Furthermore, the bit lines in the present invention suffers from little thermal budget so that they may be helpful for scale micro-shrinkage and can be made the smaller space of cell and the channel length. There are two steps for reducing the thermal budget. The peripheral gate oxide and structure of oxide/nitride/oxide are formed earlier than the formation of bit lines such that the thermal budget of memory array is reduced. The second step is to form bit line oxide by the method of high density plasma that can reduce the thermal budget of memory array.

Of course, it is to be understood that the invention need not be limited to these disclosed embodiments. Various modification and similar changes are still possible within the spirit of this invention. In this way, the scope of this invention should be defined by the appended claims.

What is claimed is:

1. A method for forming a memory cell, said method comprising:

providing a substrate;

sequentially forming a conductive layer and a stop layer on said dielectric layer;

defining a bit line pattern on said substrate to form a plurality of bit lines' forming a plurality of spacers on the sidewall of said conductive layer and said stop layer;

performing a self-aligned silicide process;

filling an oxide layer into said bit lines;

removing said oxide layer to stop on said stop layer;

removing said stop layer; and depositing a polysilicon layer to form a plurality of lines.

2. The method according to claim 1, wherein said dielectric layer is selected from the groups of an oxide/nitride/oxide layer, a single oxide layer, or a dielectric trapping layer.

3. The method according to claim 1, wherein said conductor layer is selected from the group consisting of polysilicon, tungsten, tantalum, and silicide.

4. The method according to claim 1, wherein said oxide layer is formed by high-density chemical vapor deposition method.

5. The method according to claim 4, wherein the method of removing said oxide layer to stop on said stop layer is chemical mechanism polishing method or etch back method.

6. The method according to claim 1, wherein said oxide layer is form by spin-on glass method.

7. The method according to claim 1, wherein the method of removing said oxide layer to stop on said stop layer is chemical mechanism polishing method or etch back method.

8. The method according to claim 1, wherein said dielectric layer comprises oxide.

9. The method according to claim 1, wherein said stop layer comprises a silicon nitride layer.

10. The method according to claim 1, wherein the step of defining a bit line pattern to form said bit lines comprises:

sequentially etching a portion of said stop layer, said first polysilicon layer, and said dielectric layer; and forming an implant region on said substrate by ion implantation method.

11. The method according to claim 1, wherein the step of depositing a polysilicon layer to form said word lines comprises:

depositing said polysilicon layer; and transferring a pattern of said word lines to said polysilicon layer.

12. The method according to claim 1, further comprising to form a plurality of metal oxide semiconductor devices.

13. A method for forming a memory cell, said method comprising:

providing a substrate;

forming a dielectric layer on said substrate;

sequentially forming a first polysilicon layer and a silicon nitride layer on said dielectric layer;

defining a bit line pattern on said substrate to form a plurality of bit lines;

forming a plurality of spacers on the sidewall of said first polysilicon layer and said silicon nitride layer;

performing a self-aligned silicide process;

forming an oxide layer by high-density chemical vapor deposition method;

polishing said oxide layer to stop on said silicon nitride layer by chemical mechanism polishing method;

removing said silicon nitride layer; and depositing a second polysilicon layer to form a plurality of word lines.

14. The method according to claim 13, wherein said dielectric layer is an oxide/nitride/oxide layer.

15. The method according to claim 13, wherein said dielectric layer comprises oxide.

16. The method according to claim 13, wherein the step of defining a bit line pattern on said substrate to form said bit lines comprises:

sequentially etching a portion of said stop layer, said first polysilicon layer, and said dielectric layer; and forming an implant region on said substrate by ion implantation method.

17. The method according to claim 13, wherein the step of depositing a polysilicon layer to form said word lines comprises:

depositing said second polysilicon layer; and transferring a pattern of said word lines to said second polysilicon layer.

18. The method according to claim 13, further comprising to form a plurality of metal oxide semiconductor devices.

19. A method for forming a read only memory structure, said method comprising:

providing a substrate;

forming a plurality of isolations on said substrate to form a metal oxide semiconductor device region and a cell region;

forming a dielectric layer on said cell region;

forming a threshold voltage implant region on said substrate of said metal oxide semiconductor device region;

sequentially forming a conductive layer and a stop layer on said substrate;

defining a bit line pattern on said cell region to form a plurality of bit lines;

forming a plurality of spacers on the sidewalls of said conductive layer and said stop layer;

performing a self-aligned silicide process;

filling an oxide layer into said bit lines;

removing said oxide layer to stop on said stop layer;

removing said stop layer;

depositing a polysilicon layer to form a plurality of word lines on said cell region and a polysilicon gate electrode on said metal oxide semiconductor device region;

forming a plurality of spacers on the sidewalls of said polysilicon gate electrode on said metal oxide semiconductor device region; and forming a source/drain region on said substrate of said metal oxide semiconductor device region.

20. The method according to claim 19, wherein said dielectric layer is an oxide/nitride/oxide layer.

21. The method according to claim 19, wherein said conductor layer is selected from the group consisting of polysilicon, tungsten, tantalum, and silicide.

22. The method according to claim 19, wherein said oxide layer is formed by high-density chemical vapor deposition method.

23. The method according to claim 19, wherein the method of removing said oxide layer to stop on said stop layer is chemical mechanism polishing method or etch back method.

24. The method according to claim 19, wherein said oxide layer is form by spin-on glass method.

25. The method according to claim 19, wherein the method of removing said oxide layer to stop on said stop layer is chemical mechanism polishing method or etch back method.

26. The method according to claim 19, wherein said dielectric layer is an oxide layer.

27. The method according to claim 19, wherein said stop layer comprises a silicon nitride layer.

28. The method according to claim 19, wherein said isolation devices are shallow trench isolation devices.

29. The method according to claim 19, wherein said isolation devices are field oxide regions.

30. The method according to claim 19, wherein said step of defining a bit line pattern to form said bit lines comprises:
    sequentially etching a portion of said stop layer, said first polysilicon layer, and said dielectric layer; and
    forming an implant region on said substrate by ion implantation method.

31. The method according to claim 19, wherein the step of depositing a polysilicon layer to form said word lines comprises:
    depositing said polysilicon layer; and
    transferring a pattern of said word lines to said polysilicon layer.

32. The method according to claim 1, wherein said oxide layer is formed by chemical vapor deposition.

* * * * *